(12) United States Patent
Eshelman et al.

(10) Patent No.: US 10,653,018 B2
(45) Date of Patent: May 12, 2020

(54) INDEPENDENTLY POWERED INTERACTIVE DEVICE HOLDER

(71) Applicant: 360 Electrical, L.L.C., Salt Lake City, UT (US)

(72) Inventors: Brandon Eshelman, Salt Lake City, UT (US); Cameron Bigler, Lehi, UT (US); Adam Boushley, Midvale, UT (US)

(73) Assignee: 360 Electrical, L.L.C., Salt Lake City, UT (US)

( * ) Notice: Subject to any disclaimer, the term of this patent is extended or adjusted under 35 U.S.C. 154(b) by 0 days.

(21) Appl. No.: 16/160,642

(22) Filed: Oct. 15, 2018

(65) Prior Publication Data

US 2019/0116678 A1 Apr. 18, 2019

Related U.S. Application Data (60) Provisional application No. 62/573,116, filed on Oct. 16, 2017.

(51) Int. Cl.
| | |
|---|---|
| *H05K 5/00* | (2006.01) |
| *H05K 5/02* | (2006.01) |
| *H01R 13/08* | (2006.01) |
| *H05K 7/14* | (2006.01) |
| *H01R 33/945* | (2006.01) |
| *H01R 31/06* | (2006.01) |
| *G06F 1/16* | (2006.01) |

(52) U.S. Cl.
CPC ............. *H05K 5/0026* (2013.01); *G06F 1/16* (2013.01); *H01R 13/08* (2013.01); *H01R 31/065* (2013.01); *H01R 33/945* (2013.01); *H05K 5/0217* (2013.01); *H05K 5/0247* (2013.01); *H05K 7/1427* (2013.01)

(58) Field of Classification Search
CPC .. H05K 5/0026; H05K 5/0217; H05K 5/0247; H05K 7/1427; H01R 13/08; H01R 33/945; H01R 29/00; H01R 31/06; H01R 33/975
USPC ................................ 439/131, 166, 171, 172
See application file for complete search history.

(56) References Cited

U.S. PATENT DOCUMENTS

| | | | |
|---|---|---|---|
| D233,385 S | 10/1974 | Friedman | |
| D320,992 S | 10/1991 | Jondelius | |
| 5,628,641 A * | 5/1997 | Hahn | ..................... H01R 27/00 439/131 |
| 6,089,886 A * | 7/2000 | Mareno | .................. H01R 35/04 439/131 |

(Continued)

OTHER PUBLICATIONS

Power Adapter, Eshelman, Brandon; et al., U.S. Appl. No. 29/533,871, filed Jul. 22, 2015.

(Continued)

*Primary Examiner* — Travis S Chambers
(74) *Attorney, Agent, or Firm* — Lauff Law PLLC (57) ABSTRACT

An independently powered interactive device holder is provided. In various embodiments, the holder may comprise a multi-prong bracket configured to securely hold an interactive device. In various embodiments, the holder may also comprise a power supply that is simultaneously connected to an AC plug (which in various embodiments may be foldable between a deployed position and a stowed position) and a tethered power cable and device plug.

20 Claims, 7 Drawing Sheets

(56) References Cited

U.S. PATENT DOCUMENTS

| | | | | |
|---|---|---|---|---|
| 6,091,611 | A * | 7/2000 | Lanni | H02J 7/0008 307/151 |
| D520,448 | S | 5/2006 | Lodato et al. | |
| D573,947 | S | 7/2008 | Kishimoto et al. | |
| D582,399 | S | 12/2008 | Venier et al. | |
| D634,315 | S | 3/2011 | Nousiainen | |
| D646,674 | S | 10/2011 | Liao | |
| D652,836 | S | 1/2012 | Voorhees | |
| D660,306 | S | 5/2012 | Voorhees | |
| D686,629 | S | 7/2013 | Trinh et al. | |
| 8,712,486 | B2 * | 4/2014 | Sorias | H02J 7/0042 455/575.1 |
| D705,211 | S | 5/2014 | Huang | |
| D707,662 | S | 6/2014 | Okita | |
| D709,066 | S | 7/2014 | Byun | |
| D712,394 | S | 9/2014 | Booth et al. | |
| D745,495 | S | 12/2015 | Fereday et al. | |
| D753,643 | S | 4/2016 | Kim et al. | |
| D765,064 | S | 8/2016 | Wengreen | |
| D775,534 | S | 1/2017 | Turksu et al. | |
| D777,167 | S | 1/2017 | Wengreen | |
| 9,544,005 | B2 * | 1/2017 | Wei | H04B 1/3883 |
| 9,573,532 | B2 * | 2/2017 | Riddiford | F16M 11/041 |
| D790,528 | S | 6/2017 | Lindloff | |
| D791,700 | S | 7/2017 | Loewen | |
| D792,345 | S | 7/2017 | Loewen | |
| 9,742,885 | B2 * | 8/2017 | Rostami | H02J 50/80 |
| D802,529 | S | 11/2017 | Andersson | |
| D811,334 | S | 2/2018 | Weng et al. | |
| 9,977,462 | B2 * | 5/2018 | Sorias | G06F 1/1632 |
| D823,841 | S | 7/2018 | Marini | |
| 10,027,149 | B2 * | 7/2018 | Warren | H01R 31/065 |
| 10,034,398 | B2 * | 7/2018 | Kurian | H01R 27/00 |
| 10,050,397 | B1 * | 8/2018 | Hetzroni | G06F 1/1632 |
| D847,789 | S | 5/2019 | Virhia et al. | |
| D848,412 | S | 5/2019 | Greve et al. | |
| D856,344 | S | 8/2019 | Wengreen | |
| 2006/0171145 | A1 | 8/2006 | Ford | |
| 2015/0072555 | A1 * | 3/2015 | Riddiford | F16M 11/041 439/575 |
| 2015/0230351 | A1 | 8/2015 | Yeo | |
| 2016/0380446 | A1 | 12/2016 | Loewen | |
| 2017/0324260 | A1 * | 11/2017 | Rostami | H02J 50/80 |

OTHER PUBLICATIONS

Power Adapter, Eshelman, Brandon; et al., U.S. Appl. No. 29/533,872, filed Jul. 22, 2015.
Electrical Cord Plug, Eshelman, Brandon; et al., U.S. Appl. No. 29/582,844, filed Oct. 31, 2016.
Electrical Extension Cord Receptacle End, Eshelman, Brandon; et al., U.S. Appl. No. 29/582,846, filed Oct. 31, 2016.
Electrical Extension Cord Receptacle End, Eshelman, Brandon; et al., U.S. Appl. No. 29/582,848, filed Oct. 31, 2016.
Interactive Device Holder, Eshelman, Brandon; et al., U.S. Appl. No. 29/608,848, filed Jun. 26, 2017.
Power Cord End, Eshelman, Brandon; et al., U.S. Appl. No. 29/608,851, filed Jun. 26, 2017.
Power Cord Cover, Eshelman, Brandon; et al., U.S. Appl. No. 29/615,742, filed Aug. 30, 2017.
Power Cord Cover, Eshelman, Brandon; et al., U.S. Appl. No. 29/615,743, filed Aug. 30, 2017.
Power Strip, Eshelman, Brandon; et al., U.S. Appl. No. 29/662,101, filed Aug. 31, 2018.
Power Strip, Eshelman, Brandon; et al., U.S. Appl. No. 29/662,102, filed Aug. 31, 2018.
Power Strip, Eshelman, Brandon; et al., U.S. Appl. No. 29/662,103, filed Aug. 31, 2018.
Interactive Device Holder, Eshelman, Brandon; et al., U.S. Appl. No. 29/666,680, filed Oct. 15, 2018.
Interactive Device Holder, Eshelman, Brandon; et al., U.S. Appl. No. 29/666,684, filed Oct. 15, 2018.
Interactive Device Holder, Eshelman, Brandon; et al., U.S. Appl. No. 29/666,693, filed Oct. 15, 2018.
Power Cord End With Covered Receptacles, Eshelman, Brandon; et al., U.S. Appl. No. 29/668,061, filed Oct. 26, 2018.
Power Adapter With Covered Receptacles, Eshelman, Brandon; et al., U.S. Appl. No. 29/668,062, filed Oct. 26, 2018.
Power Strip With Covered, Receptacles, Eshelman, Brandon; et al., U.S. Appl. No. 29/668,065, filed Oct. 26, 2018.
Power Strip With Covered Receptacles, Eshelman, Brandon; et al., U.S. Appl. No. 29/668,066, filed Oct. 26, 2018.
Reorientable Electrical Outlet, Gerard, Kimberly R., U.S. Appl. No. 10/996,106, filed Nov. 23, 2004.
Reorientable Electrical Receptacle, Gerard, Kimberly R., U.S. Appl. No. 11/081,282, filed Mar. 16, 2005.
Reorientable Electrical Receptacle, Gerard, Kimberly R., U.S. Appl. No. 11/302,924, filed Dec. 14, 2005.
Reorientable Electric Outlet, Gerard, Kimberly R.; et al., U.S. Appl. No. 09/458,163, filed Dec. 9, 1999.
Reorientable Electrical Receptacle, Gerard, Kimberly R., U.S. Appl. No. 11/778,948, filed Jul. 17, 2007.
Reorientable Electrical Receptacle, Gerard, Kimberly R., U.S. Appl. No. 12/835,722, filed Jul. 13, 2010.
Reorientable Electrical Receptacle, Gerard, Kimberly R., U.S. Appl. No. 13/219,865, filed Aug. 29, 2011.
Reorientable Electrical Receptacle, Gerard, Kimberly R., U.S. Appl. No. 13/541,383, filed Jul. 3, 2012.
Electrical Receptacle Faceplate, Eshelman, Brandon, U.S. Appl. No. 12/141,807, filed Jun. 18, 2008.
Electrical Receptacle Faceplate, Eshelman, Brandon, U.S. Appl. No. 13/043,003, filed Mar. 8, 2011.
Independently Powered Interactive Device Holder, Eshelman, Brandon; et al., U.S. Appl. No. 16/160,642, filed Oct. 15, 2018.
U.S. Appl. No. 29/608,848, Brandon Eshelman, filed Oct. 29, 1974.
United States Patent and Trademark Office; List of references cited by examiner (Form 892) in U.S. Appl. No. 29/666,693 along with copies of all three cited non-patent documents; Oct. 8, 2019; United States Patent and Trademark Office; Alexandria, Virginia; pp. 1-2 are Form 892, p. 3 is the first cited non-patent document, pp. 4-6 are the second cited non-patent document, and pp. 7-10 are the thrid cited non-patent document.

* cited by examiner

INDEPENDENTLY POWERED INTERACTIVE DEVICE HOLDER

CROSS-REFERENCE TO RELATED APPLICATIONS

This application claims benefit under 35 U.S.C. § 119(e) of U.S. Provisional Patent Application No. 62/573,116 filed Oct. 16, 2017.

BACKGROUND

Interactive devices, virtual assistants, artificial intelligence, and smart speakers comprise a rapidly growing area in consumer electronics. It's an area in which hardware, software, and services are expanding day by day. Each new development in hardware typically brings along with it a shortcoming in how certain users want to use the product.

For some of these types of devices, it would be convenient to keep interactive devices powered and within audible voice range, yet free up precious desktop, counter, table, or nightstand space. Users of interactive devices enjoy the benefit that is provided by the experience of interacting with the device, yet also have an increasing desire for the hardware presence to fade more into the background and existing infrastructure of the home.

BRIEF SUMMARY OF THE DISCLOSURE

Various embodiments of this disclosure comprise a multi-prong bracket to securely hold an interactive device, an external power supply (600) that is simultaneously connected to an AC plug (501) (which may be foldable) and a tethered power cable (750) and device plug (740), and a soft adhesive pad (410) for vibration dampening. For various embodiments, the end user would place the interactive device into the multi-prong bracket, attach the tethered cable (750) to the interactive device via the plug (740), and then connect the entire apparatus to a standard AC wall outlet (after unfolding the AC plug (501) if so equipped).

Using some of the embodiments of this disclosure eliminates the need to use a separate external power supply (Example—USB wall charger) and a separate power cable (Example—micro USB cable) and allows the user to have the interactive device itself plugged directly into a standard AC wall outlet and not be forced to have the device exist on desktops, counters, tables, or nightstands.

DESCRIPTION OF VARIOUS EMBODIMENTS

The terminology used herein is for the purpose of describing particular embodiments only and is not intended to be limiting. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this disclosure belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing various embodiments, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the disclosure and the claims.

The present disclosure is to be considered as an exemplification of various embodiments, and is not intended to limit the scope of the claims or the disclosure to the specific embodiments illustrated by the figures or description below. FIGS. 1-20 illustrate a currently preferred embodiment.

Figure 1:
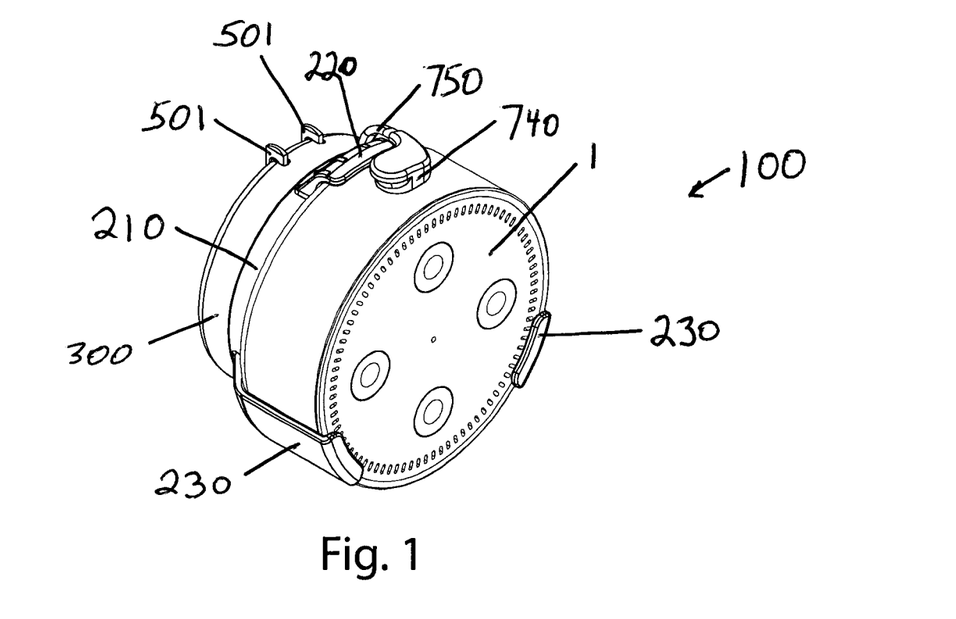
FIG. 1 is a perspective view of a preferred embodiment showing an exemplary interactive device in place.
Figure 2:
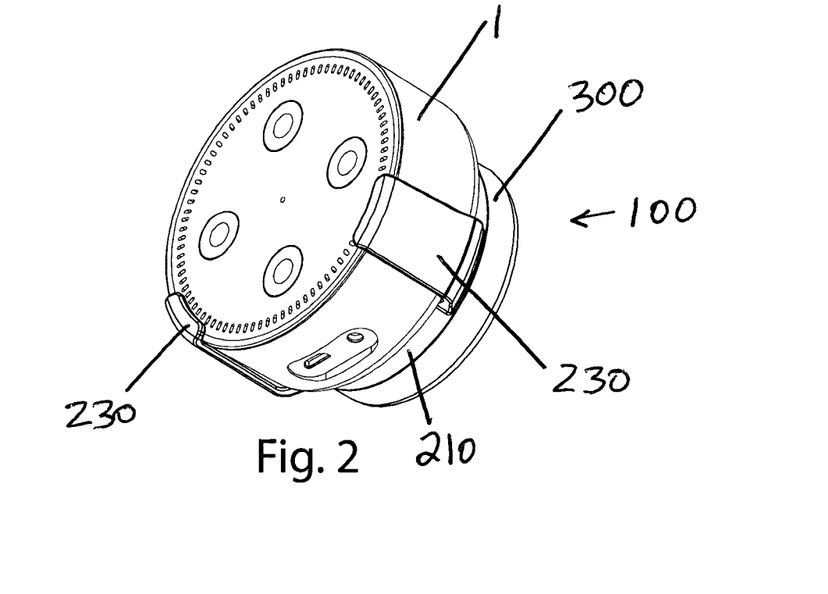
FIG. 2 is a perspective view of a preferred embodiment showing an exemplary interactive device in place.
Figure 3:
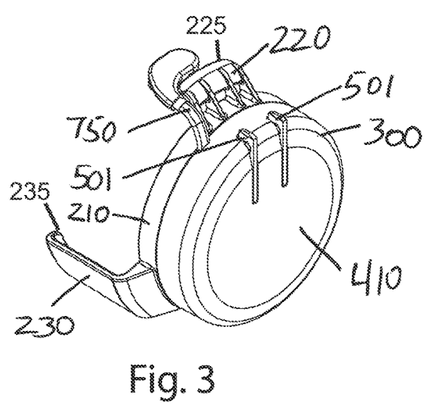
FIG. 3 is a perspective view of a preferred embodiment.
Figure 4:
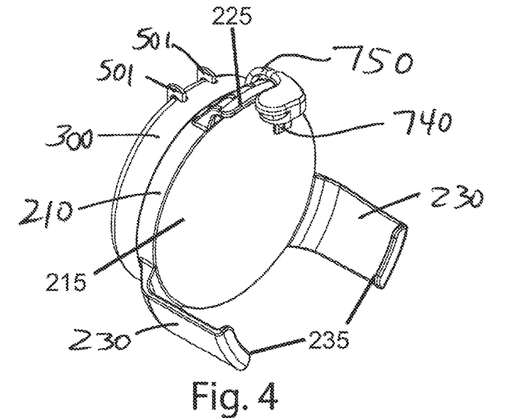
FIG. 4 is a perspective view of a preferred embodiment.
Figure 5:
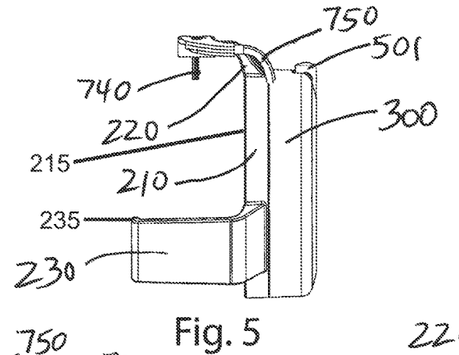
FIG. 5 is a side view of a preferred embodiment.
Figure 6:
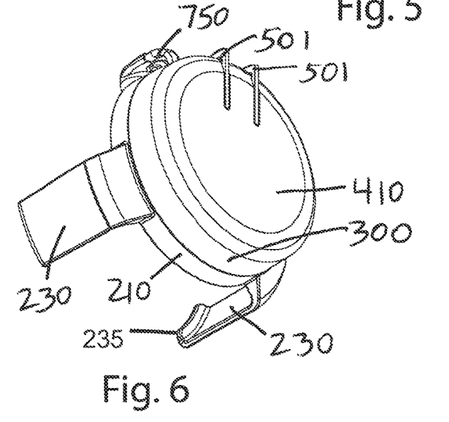
FIG. 6 is a perspective view of a preferred embodiment.
Figure 7:
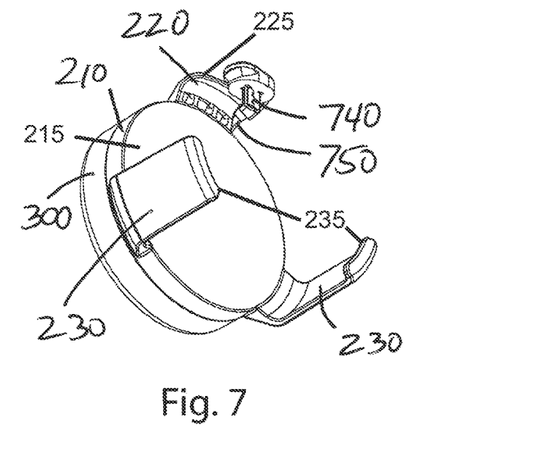
FIG. 7 is a perspective view of a preferred embodiment.
Figure 8:
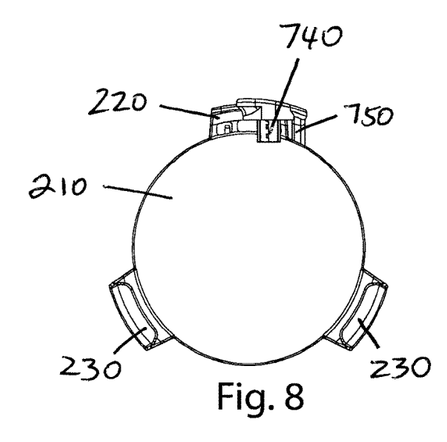
FIG. 8 is a front view of a preferred embodiment.
Figure 9:
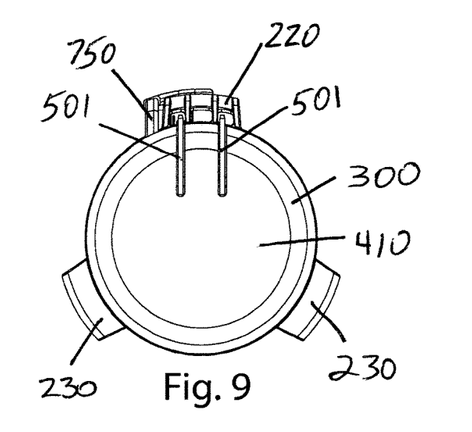
FIG. 9 is a back view of a preferred embodiment.
Figure 10:
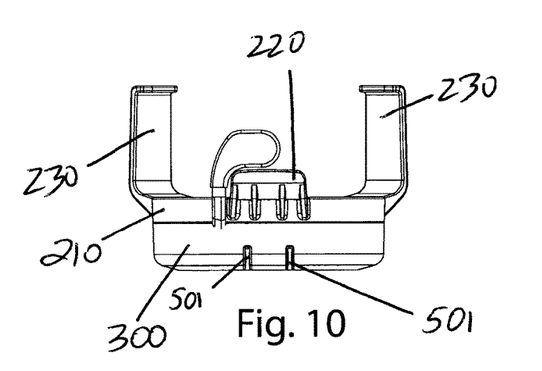
FIG. 10 is a top view of a preferred embodiment.
Figure 11:
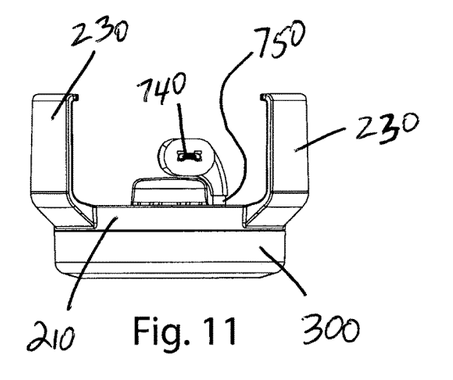
FIG. 11 is a bottom view of a preferred embodiment.
Figure 12:
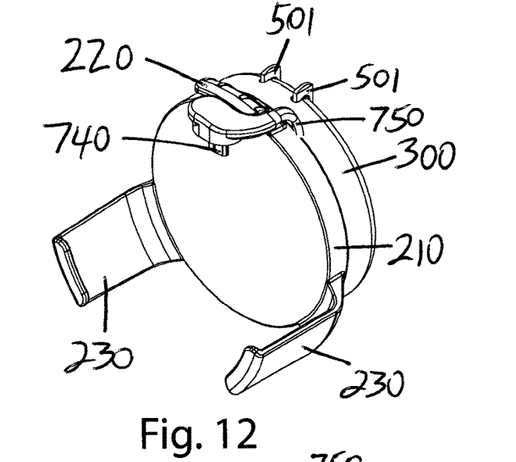
FIG. 12 is a perspective view of a preferred embodiment.
Figure 13:
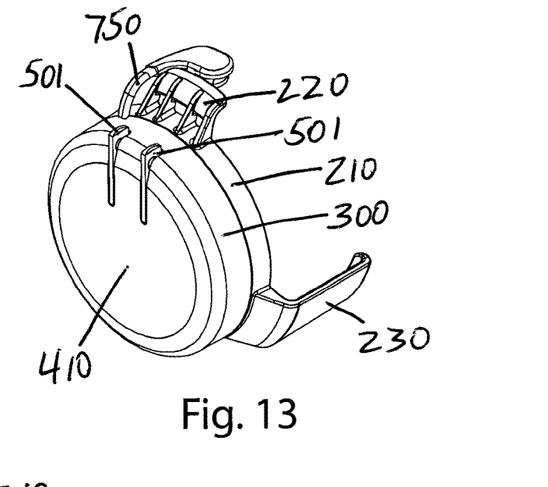
FIG. 13 is a perspective view of a preferred embodiment.
Figure 14:
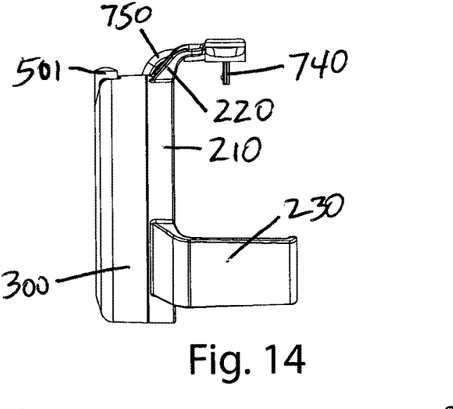
FIG. 14 is a side view of a preferred embodiment.
Figure 15:
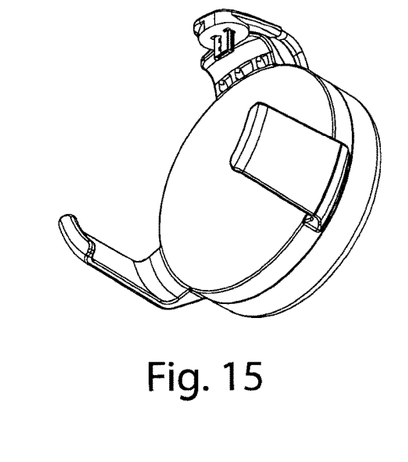
FIG. 15 is a perspective view of a preferred embodiment.
Figure 16:
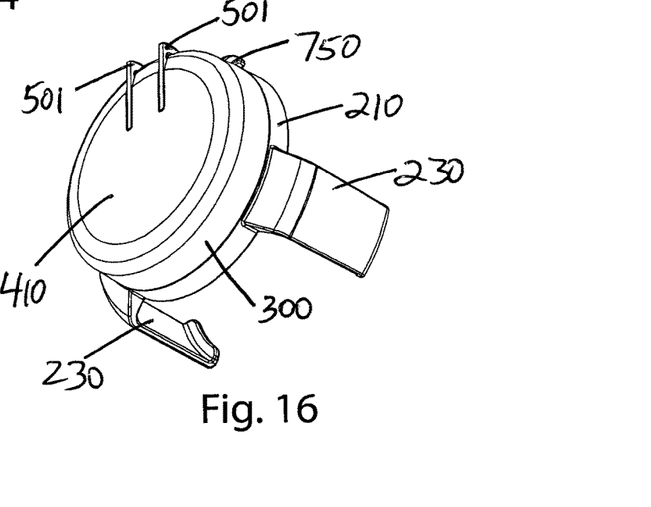
FIG. 16 is a perspective view of a preferred embodiment.

FIGS. 1 and 2 illustrate an interactive device (1) held by two lower, laterally opposed, bracket arms or prongs (230) and one upper bracket arm or prong (220) located along a central vertical axis. In other embodiments, the interactive device (1) may be held by one lower bracket arm or prong (230) located along a central vertical axis and two upper, laterally opposed, bracket arms or prongs (220). In other embodiments, the interactive device (1) may be held by two upper, laterally opposed, bracket arms (220) and two lower, laterally opposed, bracket arms (230). In other embodiments, the number and arrangement of bracket arms or prongs may vary provided that that the resulting support for the device (1) being held is sufficient. The number and arrangement of bracket arms or prongs preferably will be tailored to the particular interactive device (1) to be held, but universal designs may also be used.

In the previously described embodiments the bracket arms may be rigidly attached to the front housing (210) as shown in FIGS. 1-17, or they may be hinged or spring loaded. In some embodiments, various combinations of rigidly attached and hinged or spring loaded arms may be deployed. The bracket arms may be rigid or may have some flexibility. In some embodiments, various combinations of rigid and flexible arms may be deployed. In other embodiments, the interactive device (1) may be held by a sleeve (290) of various shapes that can be stretched over the interactive device (1) to keep it attached to the front housing (210), for example a sleeve (290) comprising soft rubber or other elastic material.

In other embodiments, the interactive device (1) may be held by a lower envelope (270) that could be a half circle, rectangle, square, or other shape suitable to cradle the interactive device (1). In these types of embodiments, the interactive device (1) might slide down from above into the lower envelope (270) which would keep it attached to the front housing (210) but would only constrain the interactive device (1) on the lower portion, leaving the upper portion unrestrained. In other embodiments, the interactive device (1) may be captured by a fully encased enclosure (280) that closes with a sliding or hinged front door (285).

FIGS. 1 and 2 also illustrate an interactive device (1) connected to an interactive device holder (100) by a tethered power cable (750) that is mechanically and rigidly captured between the front housing (210) and the back housing (300) of the device holder (100). In other embodiments, the interactive device (1) may be connected to the powered device holder (100) by a rigid and hinged power connector (760) that is attached to either one or both front housing (210) or back housing (300) of the device holder (100). In other embodiments, the interactive device (1) may be connected to the powered device holder (100) by a magnetic power connection (730). In other embodiments, the interactive device (1) may be connected to the powered device holder (100) by a power connection (720) that is itself built into the mechanism that is grasping and retaining the interactive device (1) itself. In other embodiments, the power cable (750) may be attached to a power supply (600) with a detachable connector (755) in the housing. Regardless of the configuration of the power cable (750) or other power connection, a plug (740) compatible with the interactive device (1) may be deployed at the end distal from the power supply (600). In some embodiments, the plug (740) is connected to the power supply (600) via individual wires (770), in other embodiments a ribbon cable (790) may be used, while in still other embodiments a printed circuit substrate (780) may be used. If a printed circuit substrate (780) is used, it generally will be flexible for embodiments with tethered power cables (750) or removable power cables (750), but in embodiments using a rigid and hinged power connector (760) the substrate (780) may be rigid except at the hinge (765).

In the embodiment depicted in FIGS. 3-7, the front housing (210) may be configured with a generally planar base (215). As illustrated for this depicted embodiment, an upper bracket arm (220) may have an upper bracket arm tip (225) extending a first height above the base (215), and a pair of lower bracket arms (230) may have lower bracket arm tips (235) extending a second height above the base (215). In this depicted embodiment, the second height is greater than the first height, and plug (740) is disposed proximal to the upper bracket arm tip (225) at a height above the base (215) that is greater than the first height.

Figure 17:
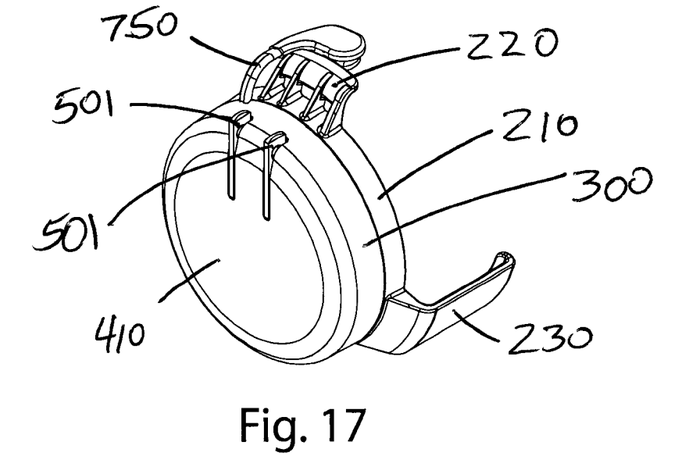
FIG. 17 is a perspective view of a preferred embodiment with a folding AC plug (501) stowed.
Figure 18:
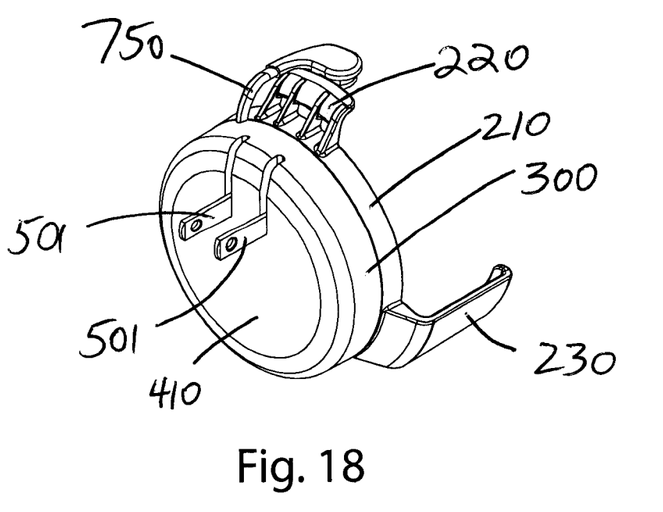
FIG. 18 is a perspective view of a preferred embodiment with a folding AC plug (501) deployed.

In the embodiment depicted in FIGS. 17 and 18, a folding AC plug (501) provides power to the interactive device holder (100) by way of plugging the AC plug (501) into a standard wall outlet. The folding AC plug (501) can either be deployed in a horizontal fashion when it's ready to be plugged into a wall outlet or it can be stowed in a vertical fashion for storage or travel use. The folding AC plug (501) may be configured to fold up for storage, or in other embodiments to fold down for storage. In this embodiment, the AC plug (501) is the sole element connecting the device holder (100) to the wall outlet. In other embodiments, the AC plug (501) may be used in conjunction with a mounting screw (130) that passes through the entire device holder (100) to mechanically fasten the device holder (100) to the wall outlet. In other embodiments, the AC plug (501) may also be fixed in the horizontal position.

FIG. 17 shows the folding AC plug (501) cutting into outlets (370) on a circular plane on the back housing (300) of the device holder (100). In this embodiment, this circular plane comprises a soft adhesive pad (410) for vibration dampening. In other embodiments, the reference plane could take on other shapes, as could the soft adhesive pad (410) or pads.

Figure 19:
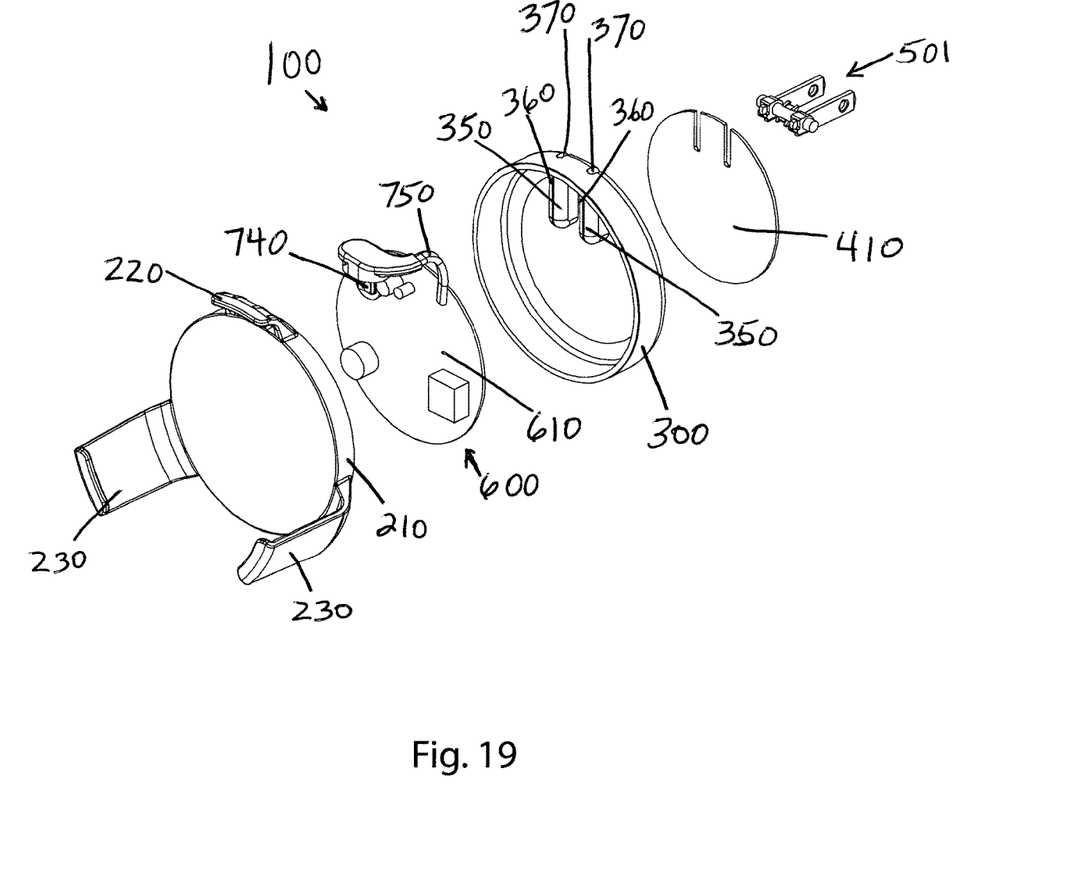
FIG. 19 is a perspective view of a preferred embodiment with various structures separated and shown in an exploded view.
Figure 20:
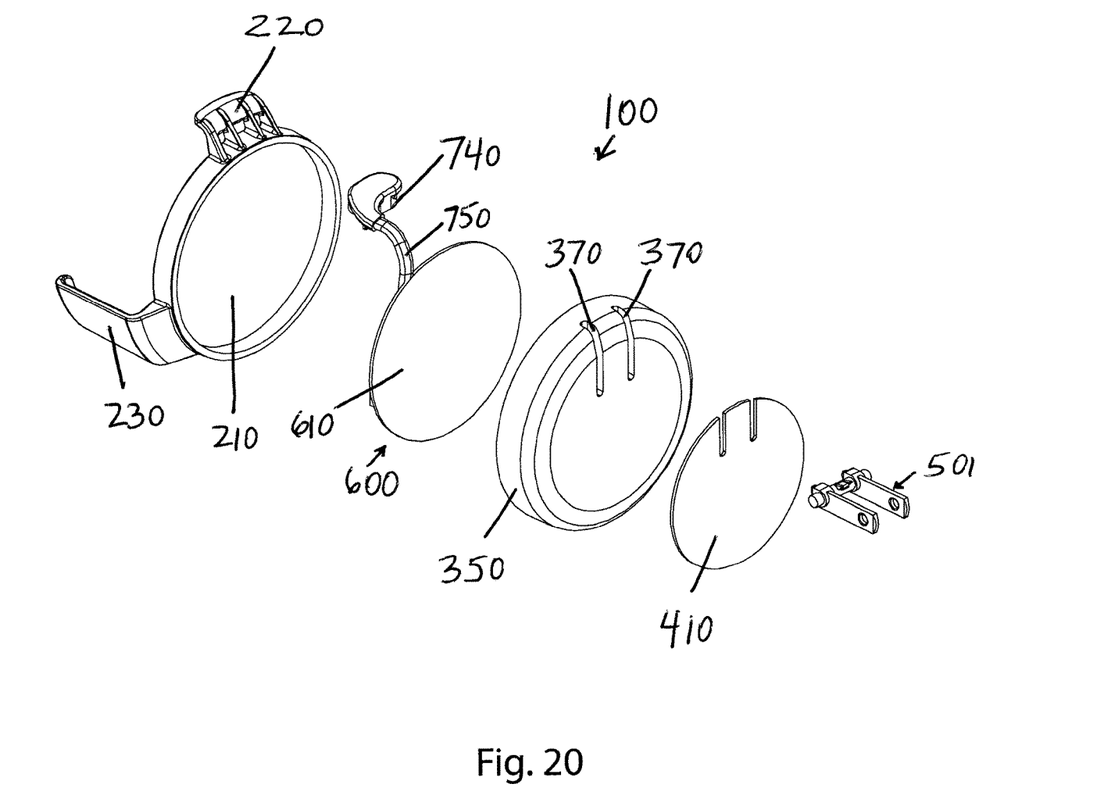
FIG. 20 is a perspective view of a preferred embodiment with various structures separated and shown in an exploded view.

FIGS. 19 and 20 illustrate two opposing exploded assembly views of a preferred embodiment of a powered interactive device holder (100). In this embodiment, the powered interactive device holder (100) comprises a front housing (210), a printed circuit board (610) with tethered power cord (750), a back housing (300), a soft adhesive pad (410), and a folding AC plug (501). The printed circuit board (610) with tethered power cable (750) is assembled in between the front housing (210) and back housing (300), which are fastened together via fasting means (150) such as screws, adhesive, welding, snaps, or other retaining arrangements know in the art. The folding AC plug (501) is mechanically assembled onto the back housing (300) and then electrically connected, through openings (360) in the back housing (300), to the printed circuit board (610). The soft adhesive pad (410) is attached to the outward face of the back housing (300).

In some embodiments, the interactive device holder (100) may comprise plural bracket arms (e.g., 220, 230) configured to retain an interactive device (1), an AC plug (501), a power supply (600), a plug (740) configured to mate with a power socket of an interactive device (1), and a connection (e.g., a power cable (750) or a conduit (760), which may comprise wires (770), a ribbon cable (790), a substrate (780), any other conductive path, or any combination thereof, a magnetic connection (730), or a connection (720) integral with a structure holding the interactive device) between the power supply (600) and the plug (740). In some embodiments, the interactive device holder (100) may comprise a cradle (260) configured to retain an interactive device (1), either in lieu of or in addition to one or more bracket arms.

In some embodiments, the AC plug (501) may be configured to fold into a housing (350) of the interactive device holder (100) for storage and rotate out of the housing for use.

In some embodiments, a connection between the power supply (600) and the plug (740) may comprise a power cable (750) tethered to a housing of the interactive device holder (100). In some embodiments, the power connection between the power supply (600) and the plug (740) may comprise a rigid conduit (760) hinged by a hinge (765) at a housing of the interactive device holder (100), either in lieu of or in addition to a power cable (750).

The invention claimed is:

1. An interactive device holder comprising:
    a front housing comprising
        an upper bracket arm disposed along a central vertical axis of the holder and
        two lower, laterally opposed, bracket arms, with
        the upper bracket arm and the lower bracket arms being configured to retain an interactive device;
    a back housing;
    a power supply comprising a printed circuit board disposed between the front housing and the back housing;
    an AC plug housing disposed on the back housing;
    an AC plug;
    openings in the back housing configured to accept electrical connections between the AC plug and the printed circuit board;
    outlets in the back housing through which portions of the AC plug are disposed; and
    a power cable captured between the front housing and the back housing, the power cable being connected at one end to the power supply and at another end to a plug configured to mate with a power socket of an interactive device.

2. The interactive device holder of claim 1 in which the AC plug is configured to fold into the AC plug housing for storage and rotate out of the AC plug housing for use.

3. The interactive device holder of claim 1 in which the AC plug is fixed into the AC plug housing.

4. An interactive device holder comprising:
    a front housing comprising
        a generally planar base,
        an upper bracket arm disposed along a central vertical axis of the holder, the upper bracket arm having a upper bracket arm tip extending a first height above the base, and
        two lower, laterally opposed, bracket arms each spaced apart from the upper bracket arm and having a lower bracket arm tip extending a second height above the base, with
        the second height greater than the first height;
    a power supply; and
    a power cable attached at one end to the power supply and at another end to a plug configured to mate with a power socket of an interactive device, the plug being disposed proximal to the upper bracket arm tip at a height above the base that is greater than the first height.

5. The interactive device holder of claim 4 in which the lower bracket arms are rigid.

6. The interactive device holder of claim 4 in which the lower bracket arms are flexible.

7. The interactive device holder of claim 4 further comprising:
    a back housing; and
    a printed circuit board disposed between the front housing and the back housing, with the printed circuit board bearing components of the power supply.

8. The interactive device holder of claim 7 further comprising:
    an AC plug housing disposed on the back housing;
    an AC plug;
    openings in the back housing configured to accept electrical connections between the AC plug and the printed circuit board; and
    outlets in the back housing through which portions of the AC plug are disposed.

9. The interactive device holder of claim 8 in which the AC plug is configured to fold into the AC plug housing for storage and rotate out of the AC plug housing for use.

10. The interactive device holder of claim 8 in which the AC plug is fixed in an extended position into the AC plug housing.

11. The interactive device holder of claim 4 in which the plug is disposed at a height above the base that is less than the second height.

12. The interactive device holder of claim 11 in which the plug is disposed proximal to the vertical axis.

13. An interactive device holder comprising:
    a front housing comprising
        a generally planar base,
        an upper bracket arm, and
        two lower, laterally opposed, bracket arms each spaced apart from the upper bracket arm and forming gaps that extend to the base;
    a power supply; and
    a power cable attached at one end to the power supply and at another end to a plug configured to mate with a power socket of an interactive device, the plug being disposed proximal to the upper bracket arm.

14. The interactive device holder of claim 13 in which the upper bracket arm has a tip extending a first height above the base, and the plug is disposed at a height above the base that exceed the first height.

15. The interactive device holder of claim 13 in which the lower bracket anus are rigid.

16. The interactive device holder of claim 13 in which the lower bracket arms are flexible.

17. The interactive device holder of claim 13 further comprising:
    a back housing; and
    a printed circuit board disposed between the front housing and the back housing, with the printed circuit board bearing components of the power supply.

18. The interactive device holder of claim 17 further comprising:
    an AC plug housing disposed on the back housing;
    an AC plug;
    openings in the back housing configured to accept electrical connections between the AC plug and the printed circuit board; and
    outlets in the back housing through which portions of the AC plug are disposed.

19. The interactive device holder of claim 18 in which the AC plug is configured to fold into the AC plug housing for storage and rotate out of the AC plug housing for use.

20. The interactive device holder of claim 18 in which the AC plug is fixed in an extended position into the AC plug housing.

* * * * *